(12) United States Patent
Shimooka et al.

(10) Patent No.: US 9,806,232 B2
(45) Date of Patent: Oct. 31, 2017

(54) NITRIDE SEMICONDUCTOR ELEMENT AND METHOD FOR MANUFACTURING THE SAME

(71) Applicant: NICHIA CORPORATION, Anan-shi, Tokushima (JP)

(72) Inventors: Tomohiro Shimooka, Tokushima (JP); Masahiko Sano, Anan (JP); Naoki Azuma, Katsuura-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/726,132

(22) Filed: May 29, 2015

(65) Prior Publication Data

US 2015/0349203 A1 Dec. 3, 2015

(30) Foreign Application Priority Data

May 30, 2014 (JP) .................................. 2014-111966
May 27, 2015 (JP) .................................. 2015-107307

(51) Int. Cl.
*H01L 33/20* (2010.01)
*H01L 33/32* (2010.01)
*H01L 33/00* (2010.01)
*H01L 33/02* (2010.01)
*H01L 33/12* (2010.01)
*H01L 33/16* (2010.01)

(52) U.S. Cl.
CPC ............ *H01L 33/32* (2013.01); *H01L 33/007* (2013.01); *H01L 33/025* (2013.01); *H01L 33/20* (2013.01); *H01L 33/12* (2013.01); *H01L 33/16* (2013.01)

(58) Field of Classification Search
None
See application file for complete search history.

(56) References Cited

U.S. PATENT DOCUMENTS

| 7,771,532 B2 | 8/2010 | Uematsu et al. |
| 7,772,585 B2 | 8/2010 | Uematsu et al. |
| 8,236,591 B2 | 8/2012 | Ichihara et al. |
| 8,779,463 B2 | 7/2014 | Narita et al. |

(Continued)

FOREIGN PATENT DOCUMENTS

| EP | 1 667 241 A1 | 6/2006 |
| JP | 2007-116097 A | 5/2007 |

(Continued)

OTHER PUBLICATIONS

Extended European Search Report issued in corresponding European application No. 15169765 dated Oct. 15, 2015.

*Primary Examiner* — Johannes P Mondt
(74) *Attorney, Agent, or Firm* — Foley & Lardner LLP

(57) ABSTRACT

A nitride semiconductor element includes a sapphire substrate including: a main surface extending in a c-plane of the sapphire substrate, and a plurality of projections disposed at the main surface, the plurality of projections including at least one projection having an elongated shape in a plan view; and a nitride semiconductor layer disposed on the main surface of the sapphire substrate. The at least one projection has an outer edge extending in a longitudinal direction of the elongated shape, the outer edge extending in a direction oriented at an angle in a range of −10° to +10° with respect to an a-plane of the sapphire substrate in the plan view.

15 Claims, 15 Drawing Sheets

(56) References Cited

U.S. PATENT DOCUMENTS

| | | |
|---|---|---|
| 2003/0057444 A1 | 3/2003 | Niki et al. |
| 2007/0085093 A1* | 4/2007 | Ohmae .................. C30B 23/04 257/89 |
| 2011/0121334 A1 | 5/2011 | Dai et al. |
| 2011/0212559 A1 | 9/2011 | Ohmae et al. |
| 2012/0074431 A1* | 3/2012 | Narita ................ H01L 21/0242 257/79 |
| 2012/0126241 A1 | 5/2012 | Okuno et al. |
| 2013/0285109 A1 | 10/2013 | Narita et al. |
| 2014/0306265 A1 | 10/2014 | Narita et al. |

FOREIGN PATENT DOCUMENTS

| | | |
|---|---|---|
| JP | 2007-134443 A | 5/2007 |
| JP | 2007-254258 A | 10/2007 |
| JP | 2008-053385 A | 3/2008 |
| JP | 2008-091942 A | 4/2008 |
| JP | 2012-114204 A | 6/2012 |
| WO | WO-2009/020033 A1 | 2/2009 |
| WO | WO-2012/002240 A1 | 1/2012 |
| WO | WO-2012/018116 A1 | 2/2012 |

* cited by examiner

[Fig. 1]
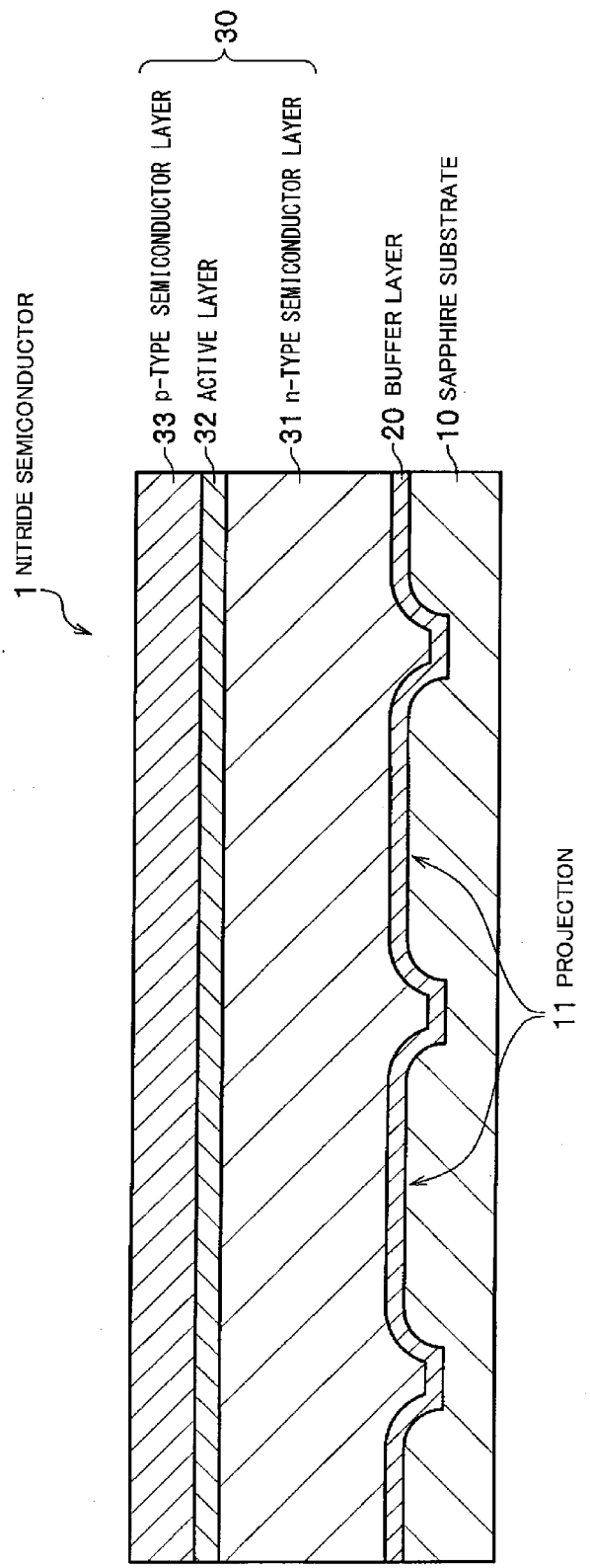

[Fig. 2A]
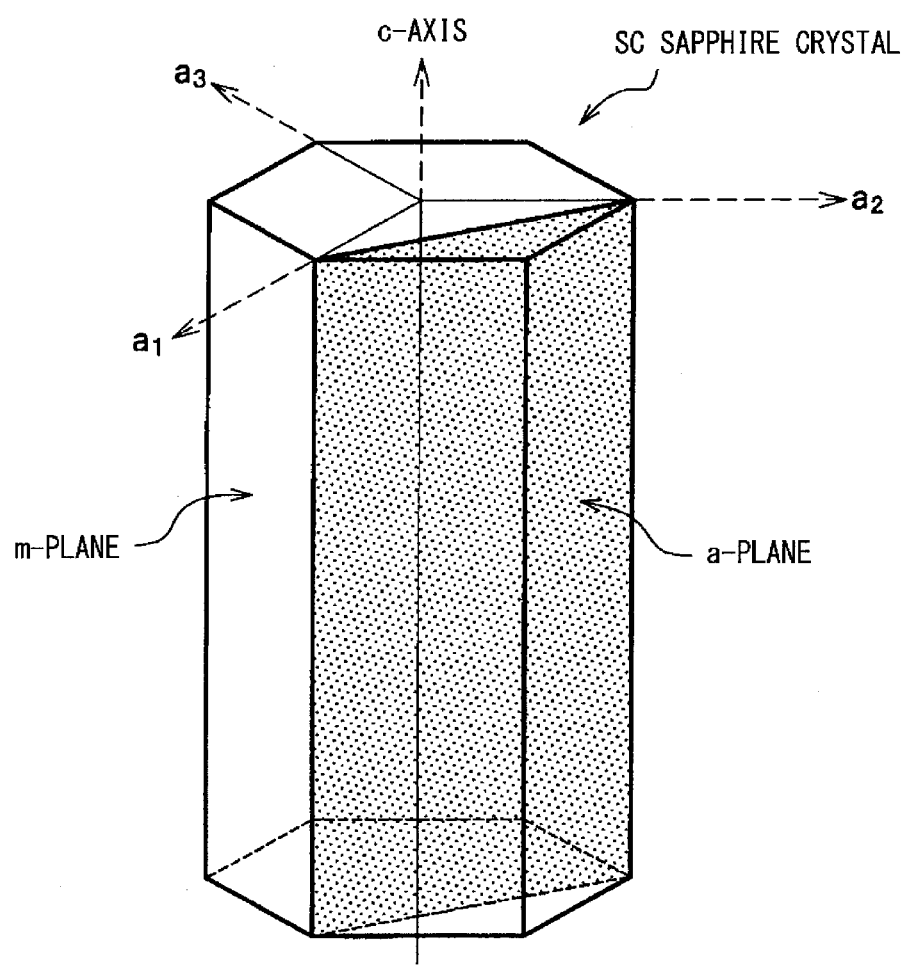

[Fig. 2B]
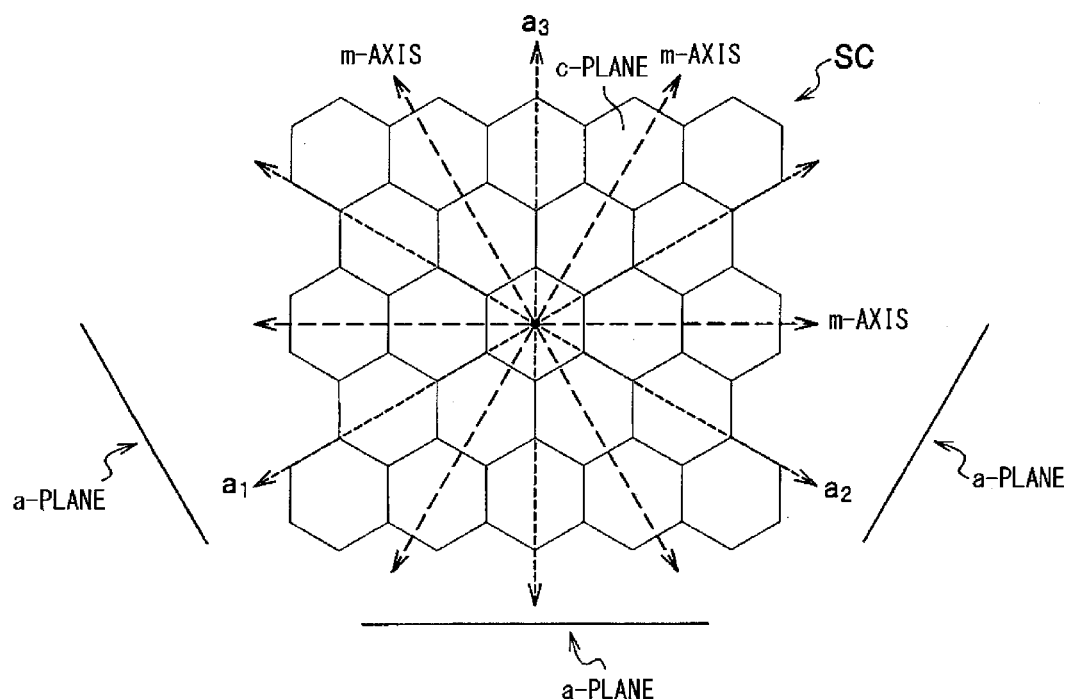

[Fig. 3]
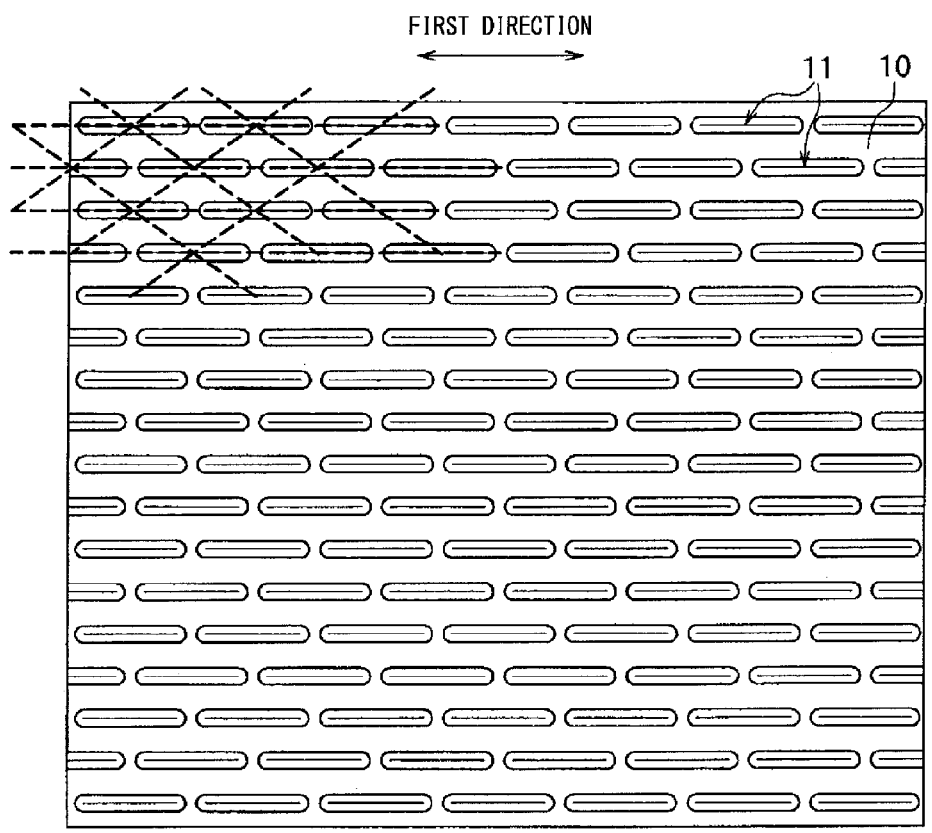
[Fig. 4A]
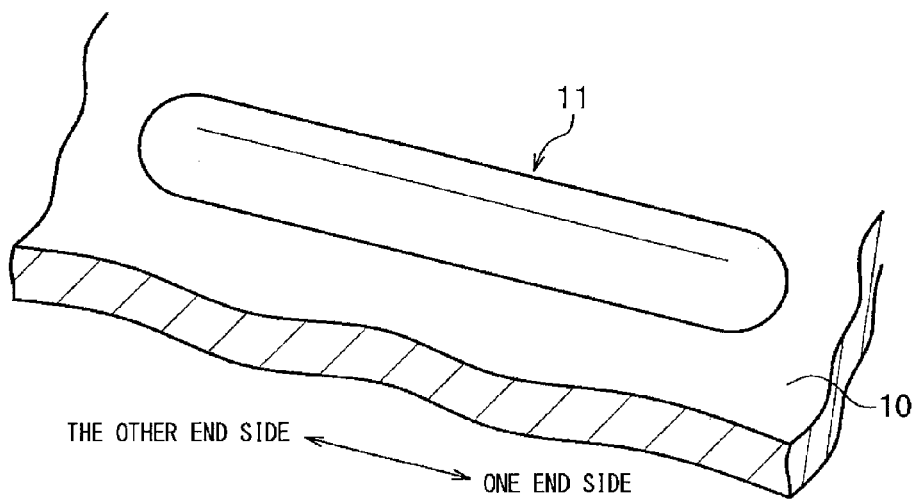

[Fig. 4B]
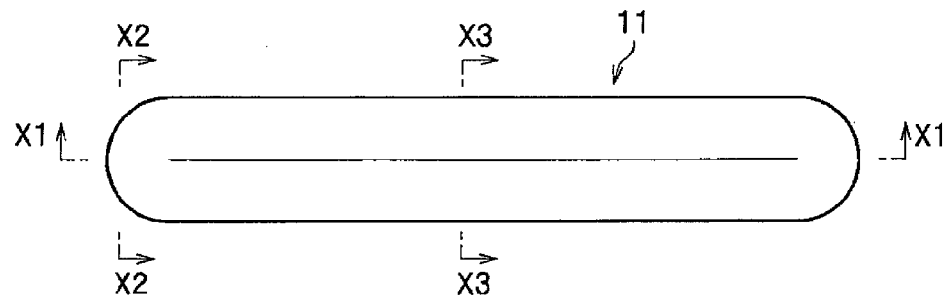
[Fig. 4C]
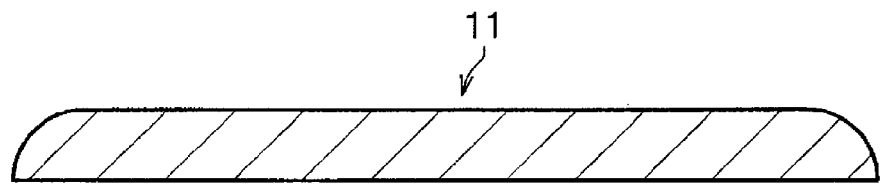
[Fig. 4D]
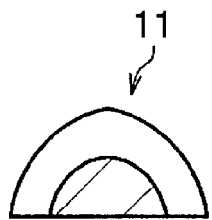
[Fig. 4E]
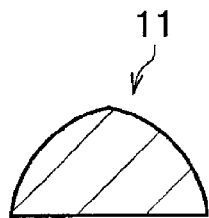

[Fig. 5A]
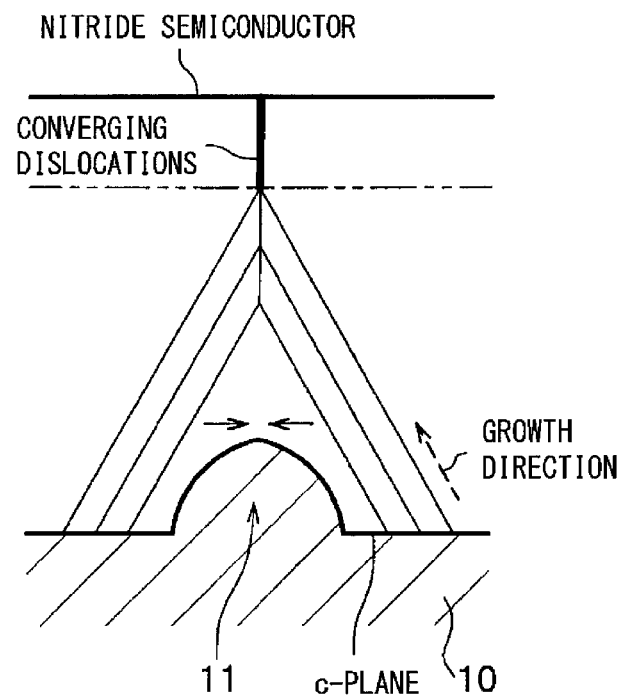
[Fig. 5B]
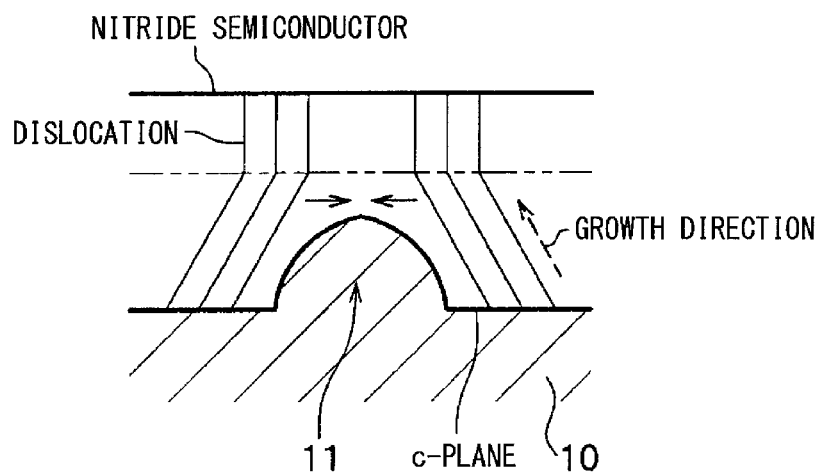

[Fig. 6A]
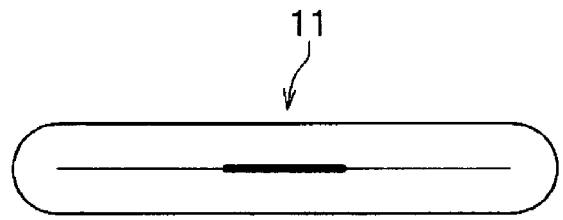
FIRST DIRECTION
[Fig. 6B]
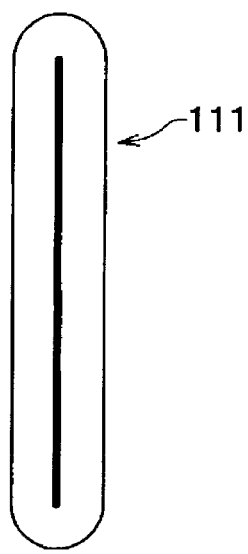
FIRST DIRECTION
[Fig. 7A]
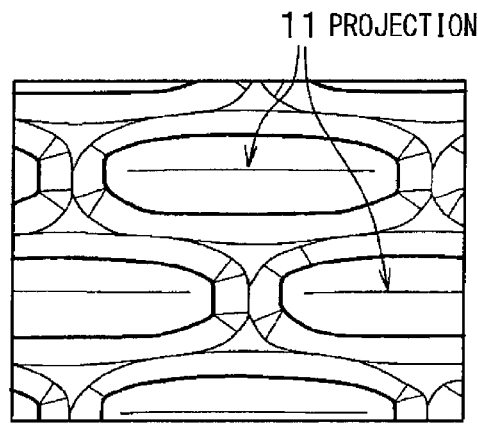

[Fig. 7B]
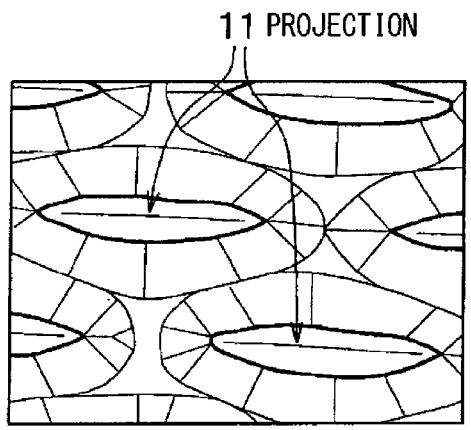
[Fig. 7C]
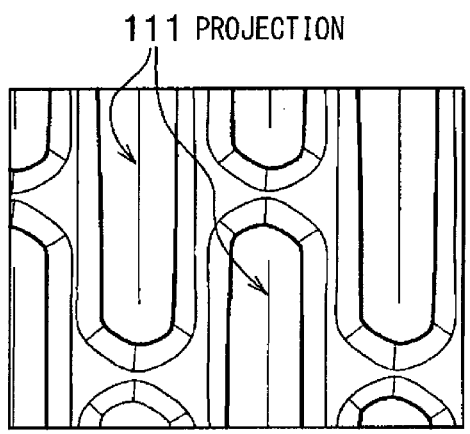
[Fig. 7D]
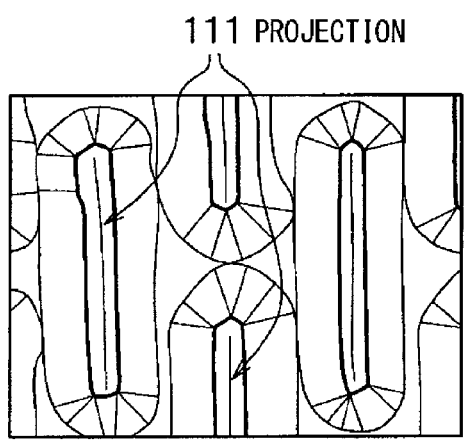

[Fig. 8A]
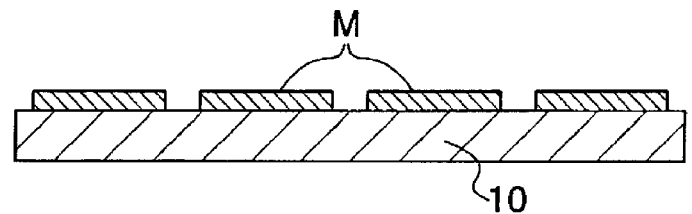
[Fig. 8B]
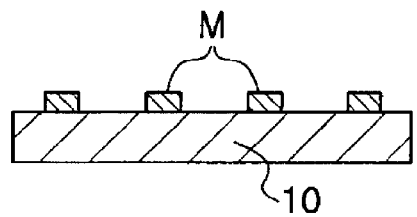
[Fig. 8C]
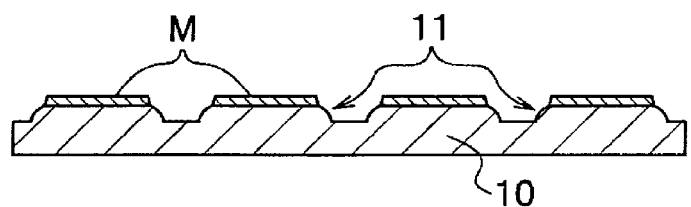
[Fig. 8D]
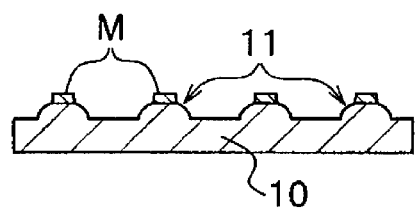
[Fig. 8E]
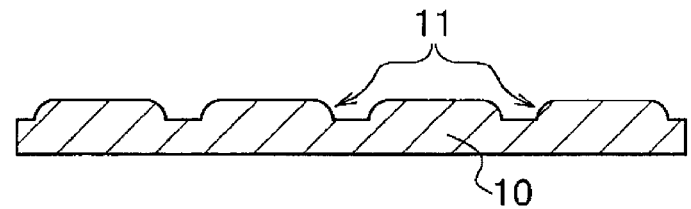

[Fig. 8F]
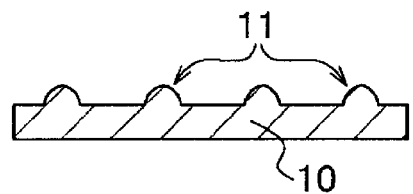
[Fig. 9A]
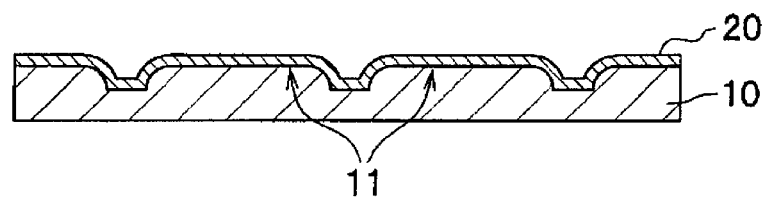
[Fig. 9B]
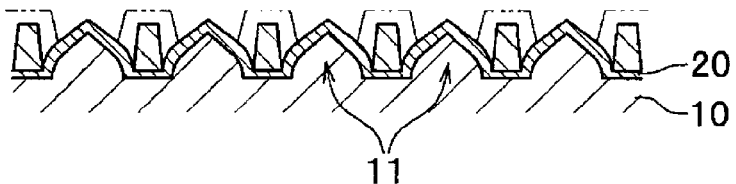
[Fig. 9C]
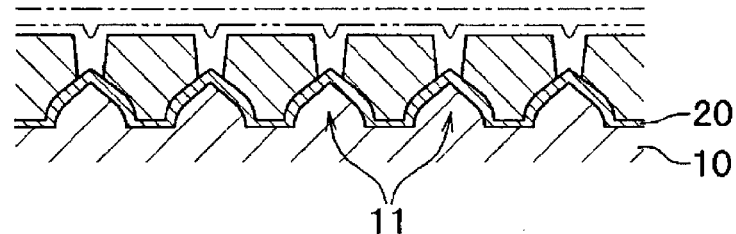
[Fig. 9D]
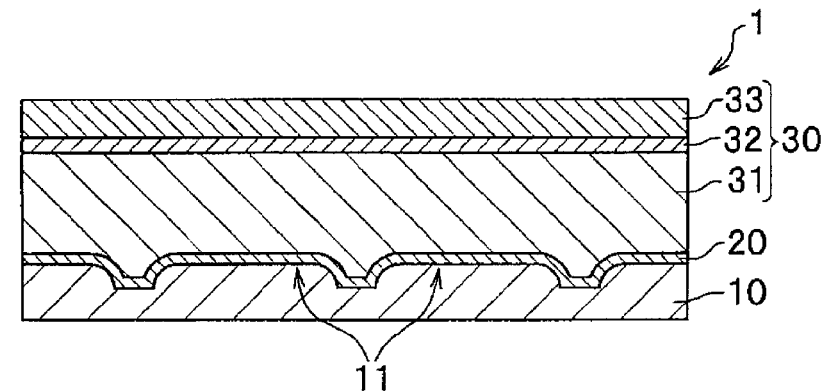

[Fig. 9E]
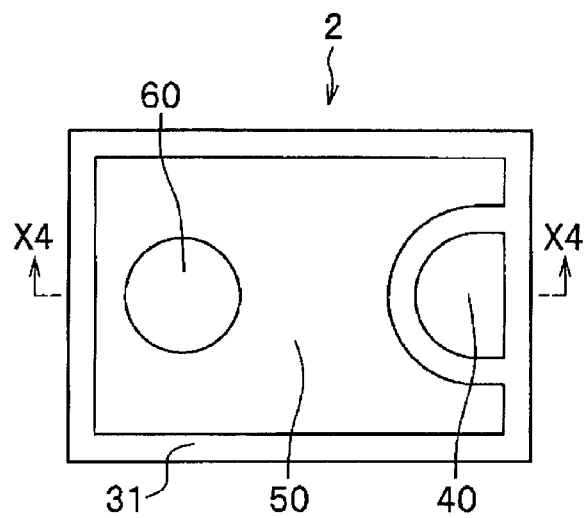
[Fig. 9F]
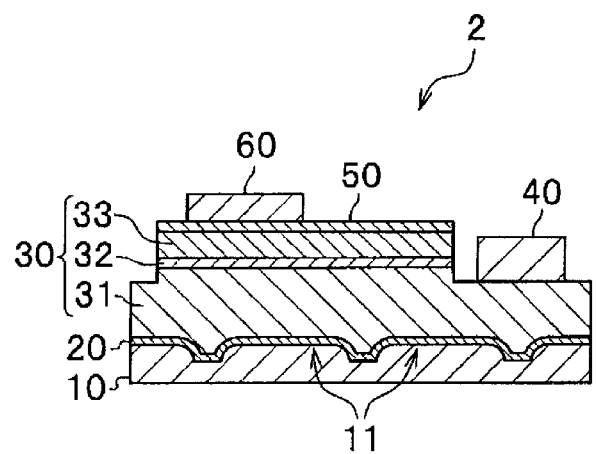

[Fig. 10]
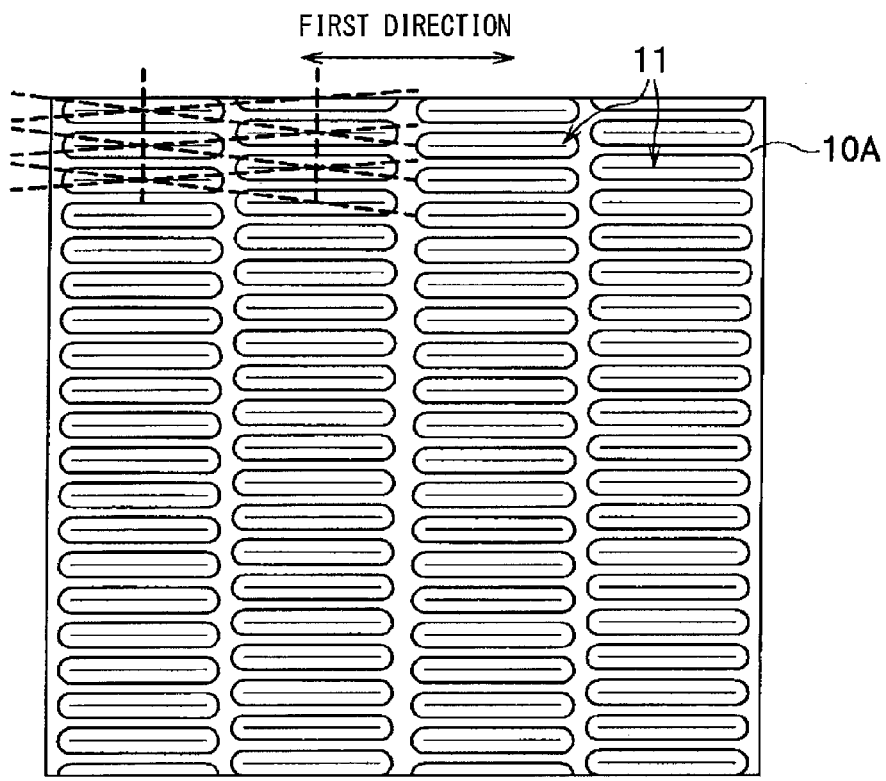
[Fig. 11]
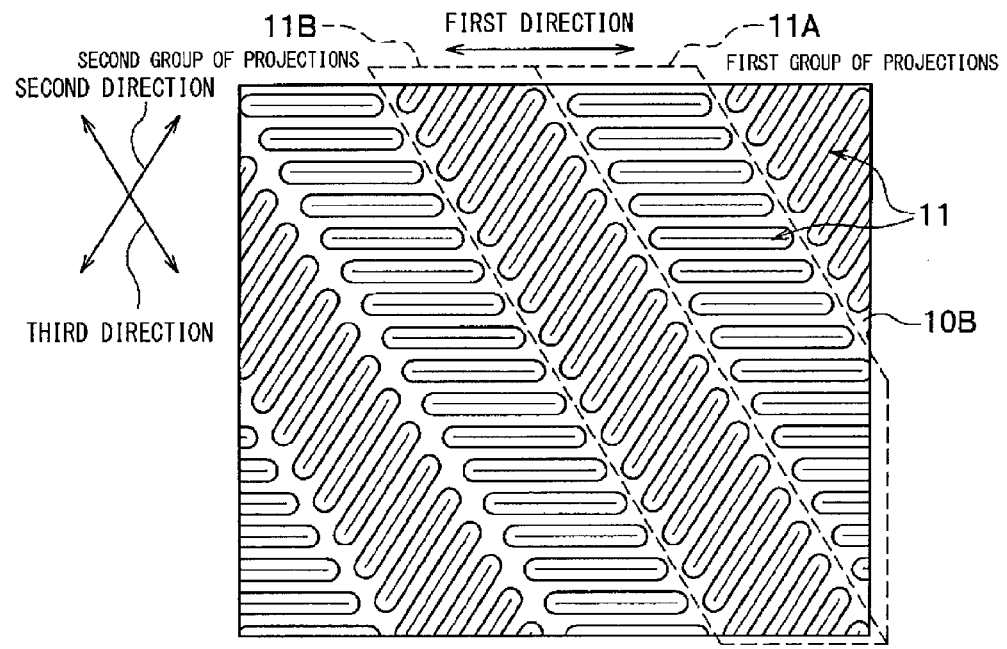

[Fig. 12]
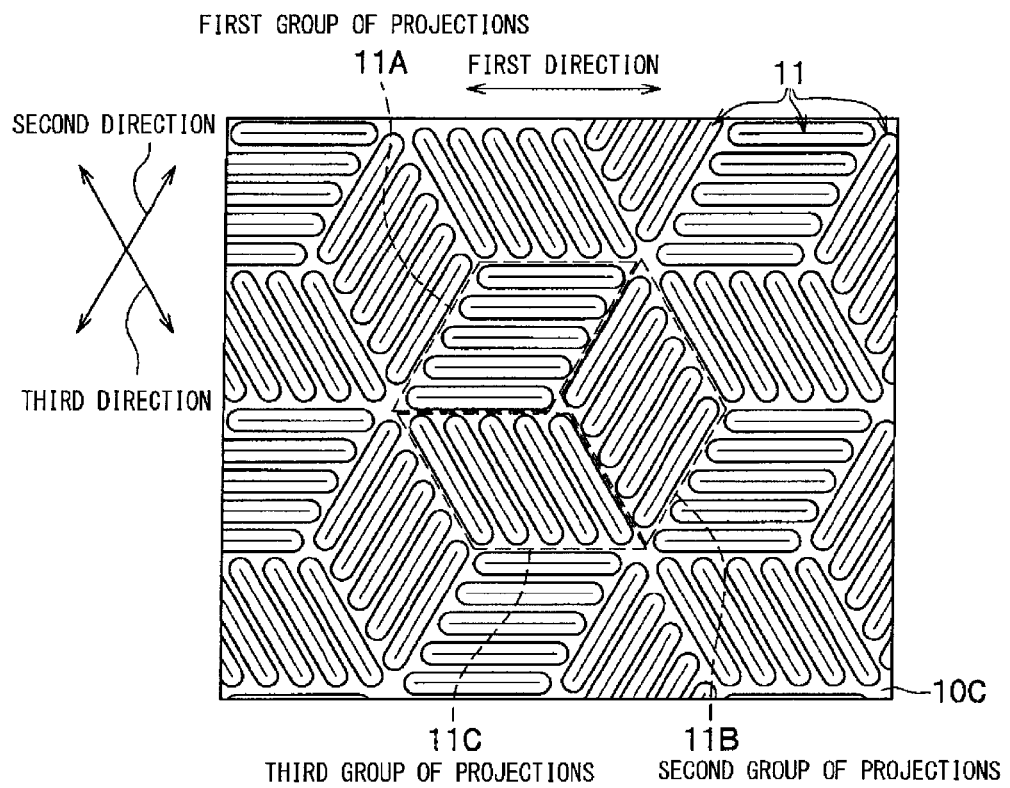
[Fig. 13A]
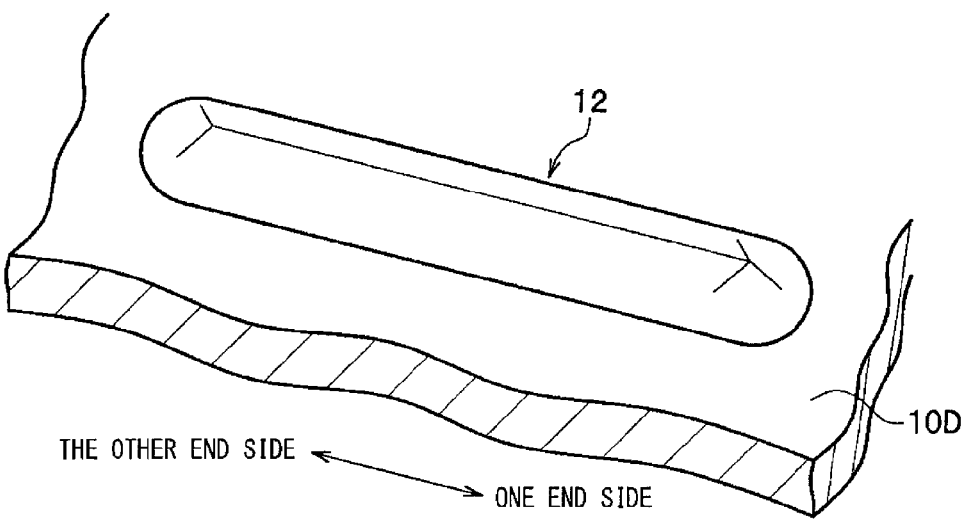

[Fig. 13B]
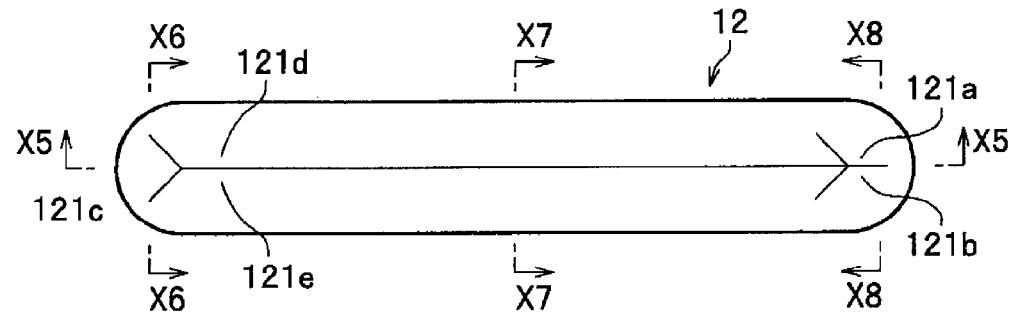
[Fig. 13C]
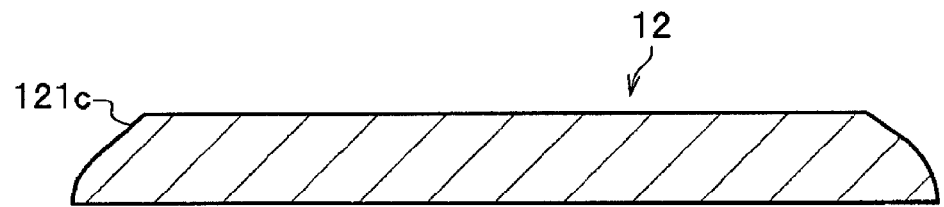
[Fig. 13D]
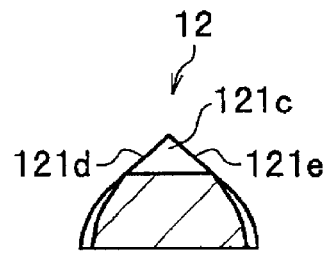
[Fig. 13E]
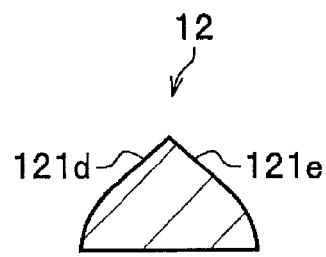

[Fig. 13F]
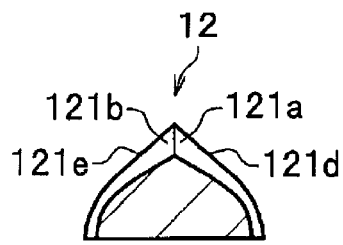
[Fig. 14]
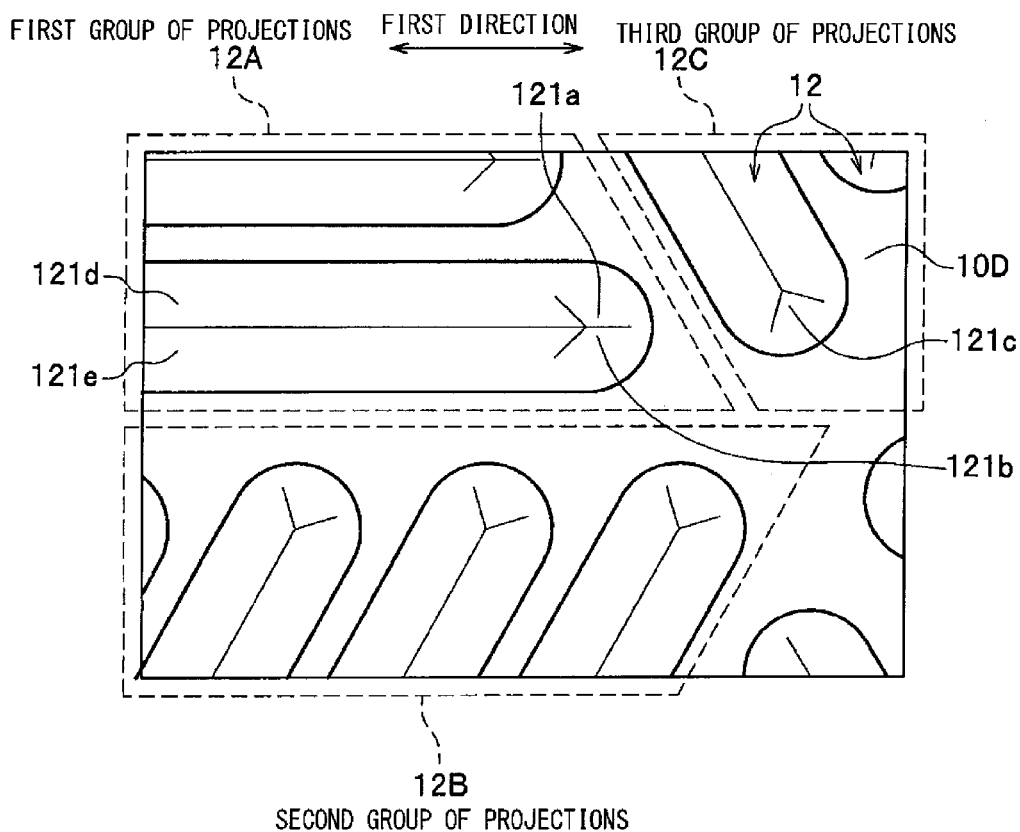

NITRIDE SEMICONDUCTOR ELEMENT AND METHOD FOR MANUFACTURING THE SAME

CROSS-REFERENCE TO RELATED APPLICATIONS

The present application claims priority on Japanese Patent Application No. 2014-111966, filed May 30, 2014, and Japanese Patent Application No. 2015-107307, filed May 27, 2015, which are incorporated by reference in their entireties.

BACKGROUND

Technical Field

The present disclosure relates to a nitride semiconductor element that is formed by crystal growth from a substrate, and a method for manufacturing the same.

Description of the Related Art

A light emitting diode (LED) made of a nitride semiconductor is normally formed by sequentially stacking an n-type semiconductor layer, an active layer and a p-type semiconductor layer on a sapphire substrate. Conventionally, there has been proposed a technique which involves providing a structure with elongated recess portions or a composite structure with elongated projection and recess portions at a sapphire substrate in advance in order to improve the light emission efficiency of a light emitting diode (see, for example, JP 2008-53385 A, JP 2008-91942 A, and JP 2012-114204 A).

The sapphire substrate with elongated trenches (i.e. recess portions) mentioned above has a certain effect of reducing a dislocation density. However, if timing of crystal growth differs between the bottom surface of the trench and an upper surface of the sapphire substrate having no trench, the crystallinity would become deteriorated.

SUMMARY

Embodiments of the present invention have been made in view of the foregoing points, and it is an object of certain embodiments to provide a nitride semiconductor element and a method for manufacturing the same that can improve its temperature characteristics while having a certain effect of reducing the dislocation density.

A nitride semiconductor element according to one embodiment of the present invention includes: a sapphire substrate having a c-plane as a main surface, and a plurality of projections provided at the main surface, the plurality of projections including a projection having an elongated shape in a plan view; and a nitride semiconductor layer provided on the main surface of the sapphire substrate, in which the projection has an outer edge thereof in a longitudinal direction of the elongated shape, the outer edge extending in a direction oriented at an angle in a range of −10° to +10° with respect to an a-plane of the sapphire substrate in the plan view.

A method for manufacturing a nitride semiconductor element according to another aspect of the present invention includes: dry-etching a surface on a c-plane side of a sapphire substrate by providing a mask on the surface to form a plurality of projections, the plurality of projections include a projection having an elongated shape in a plan view, an outer edge of the projection in a longitudinal direction of the elongated shape being positioned at an angle in a range of −10° to +10° with respect to an a-plane of the sapphire substrate; and growing a nitride semiconductor layer on the surface of the sapphire substrate with the projections formed thereat.

According to embodiments of the present invention, the nitride semiconductor element includes a nitride semiconductor layer having a low dislocation density and grown from the sapphire substrate with the elongated projections, and thus can have improved temperature characteristics. Further, according to embodiments of the present invention, the method for manufacturing a nitride semiconductor element uses a sapphire substrate with elongated projections, thereby enabling a reduction in the dislocation density of the nitride semiconductor layer. Thus, the temperature characteristics of the thus-obtained nitride semiconductor element can be improved.

BRIEF DESCRIPTION OF THE DRAWINGS

FIG. 1 is a cross-sectional view schematically showing an entire structure of a nitride semiconductor element according to a first embodiment of the present invention.

FIGS. 2A and 2B schematically shows plane orientations of a sapphire crystal in a sapphire substrate. FIG. 2A is a diagram of a unit cell and FIG. 2B is a plan view of a sapphire crystal structure.

FIG. 3 is a plan view schematically showing a substrate for nitride semiconductor element according to the first embodiment of the present invention.

FIGS. 4A to 4E schematically shows projections formed at the substrate for nitride semiconductor element according to the first embodiment of the present invention. FIG. 4A is a perspective view of the projection, FIG. 4B is a plan view of the projection, FIG. 4C is a cross-sectional view taken along the line X1-X1 of FIG. 4B, FIG. 4D is a cross-sectional view taken along the line X2-X2 of FIG. 4B and FIG. 4E is a cross-sectional view taken along the line X3-X3 of FIG. 4B.

FIGS. 5A and 5B are explanatory diagrams showing the direction of crystal growth of the nitride semiconductor and the convergent state of dislocations in the nitride semiconductor.

FIG. 6A is a diagram showing an aggregate of facets in the projection whose outer edge in the longitudinal direction extends in a first direction, and FIG. 6B is a diagram showing an aggregate of facets in the projection whose outer edge in the longitudinal direction extends in a direction perpendicular to the first direction.

FIGS. 7A to 7D are diagrams made based on images taken by a scanning electron microscope (SEM), showing the state of GaN grown on the sapphire substrate with elongated projections formed thereon, in which FIGS. 7A and 7B are diagrams showing examples where outer edges of the projections in the longitudinal direction extend in the direction of an a-plane of the sapphire substrate, and FIGS. 7C and 7D are diagrams showing examples where outer edges of the projections in the longitudinal direction extend in the direction of a c-plane of the sapphire substrate.

FIGS. 8A to 8F schematically show a method for manufacturing a substrate for nitride semiconductor element according to the first embodiment of the present invention. FIG. 8A is a cross-sectional view of a mask formation step as viewed from the side surface, FIG. 8B is a cross-sectional view of the mask formation step as viewed from the front surface, FIG. 8C is a cross-sectional view of an intermediate stage of an etching step as viewed from the side surface, FIG. 8D is a cross-sectional view of an intermediate stage of the etching step as viewed from the front surface, FIG. 8E is a cross-sectional view of the state of an end of dry etching in the etching step as viewed from the side surface and FIG. 8F is a cross-sectional view of the state of the end of the dry etching in the etching step as viewed from the front surface.

FIGS. 9A to 9F schematically show a method for manufacturing a nitride semiconductor element according to the first embodiment of the present invention. FIG. 9A is a cross-sectional view of a buffer layer formation step as viewed from the side surface, FIG. 9B is a cross-sectional view of an intermediate stage of a semiconductor growth step as viewed from the front surface, FIG. 9C is a cross-sectional view of an intermediate stage of the semiconductor growth step as viewed from the front surface, FIG. 9D is a cross-sectional view of a semiconductor layer growth step as viewed from the side surface, FIG. 9E is a plan view showing one example of the nitride semiconductor element including an electrode formed after the semiconductor layer growth step and FIG. 9F is a cross-sectional view taken along the line X4-X4 of FIG. 9E, showing one example of the nitride semiconductor element including the electrode formed after the semiconductor layer growth step.

FIG. 10 is a plan view schematically showing a substrate for a nitride semiconductor element according to a second embodiment of the present invention.

FIG. 11 is a plan view schematically showing a substrate for a nitride semiconductor element according to a third embodiment of the present invention.

FIG. 12 is a plan view schematically showing a substrate for a nitride semiconductor element according to a fourth embodiment of the present invention.

FIGS. 13A to 13F schematically show projections formed at the substrate for nitride semiconductor element according to a fifth embodiment of the present invention. FIG. 13A is a perspective view of the projection, FIG. 13B is a plan view of the projection, FIG. 13C is a cross-sectional view taken along the line X5-X5 of FIG. 13B, FIG. 13D is a cross-sectional view taken along the line X6-X6 of FIG. 13B, FIG. 13E is a cross-sectional view taken along the line X7-X7 of FIG. 13B and FIG. 13F is a cross-sectional view taken along the line X8-X8 of FIG. 13B.

FIG. 14 is a plan view schematically showing a substrate for a nitride semiconductor element according to the fifth embodiment of the present invention.

DETAILED DESCRIPTION OF THE EMBODIMENTS

A nitride semiconductor element and a method for manufacturing the same according to embodiments of the present invention will be described with reference to the accompanying drawings. The drawings referred in the description below schematically illustrate embodiments of the present invention. Some drawings may exaggerate the scale, distance, positional relationship, and the like of respective members, or may omit the illustration of a part of the member. In the description below, the same reference names and characters denote the same or similar members in principle, and a detailed description thereof will be omitted as appropriate.

First Embodiment

[Structure of Nitride Semiconductor Element]

The structure of a nitride semiconductor element according to a first embodiment of the present invention will be described below with reference to FIGS. 1 to 4. As shown in FIG. 1, a nitride semiconductor element 1 has a stacked structure, in which a sapphire substrate 10 serving as a substrate for nitride semiconductor element, a buffer layer 20 and a nitride semiconductor layer 30 are stacked.

The sapphire substrate (substrate for nitride semiconductor element) 10 is to grow a nitride semiconductor (e.g., GaN) thereon, while supporting the nitride semiconductor layer 30. As shown in FIGS. 1 and 3, the sapphire substrate 10 is formed in a flat plate shape, and has on its upper surface, a plurality of projections 11 (convex portion 11) formed in an elongated shape in a plan view. The sapphire substrate 10 including the above-mentioned projections 11 is formed in a thickness of, e.g., 50 µm to 300 µm as a whole.

The term "an elongated shape in a plan view" as used herein means the shape in which a length of the shape taken in the direction that maximizes the length of the shape in a plan view (in the longitudinal direction) is longer than a length of the shape taken in the direction that minimizes the length of the shape (in the width direction) in the plan view, and preferably means that the length in the longitudinal direction is twice or more as long as that in the width direction as will be discussed below.

The projection 11 is to improve the light extraction efficiency of the nitride semiconductor element 1, and also to be capable of reducing the dislocation density when crystals of the nitride semiconductor are grown on the sapphire substrate 10. Here, as shown in FIG. 2A, the sapphire substrate 10 is formed of a sapphire crystal SC having a hexagonal crystal structure with a c-plane ((0001) plane) serving as a main surface of the substrate. Note that the term "c-plane" as used in the present specification may include a plane with an off angle that is slightly inclined with respect to the c-plane. The off angle is, for example, approximately 3° or less. The above-mentioned projection 11 is formed at the c-plane side surface as the main surface. As shown in FIGS. 2A and 2B, the sapphire crystal SC has, in addition to the c-plane, six m-planes which are side surfaces of a hexagonal column shown in a unit cell diagram, and three a-planes respectively perpendicular to an $a_1$-axis, an $a_2$-axis and an $a_3$-axis. The directions perpendicular to one of the m-planes are m-axis directions. The m-axis directions include three directions that extend in directions displaced from the directions of the $a_1$-axis, $a_2$-axis and $a_3$-axis, respectively by 30 degrees.

A number of (a plurality of) projections 11 with substantially the same shape may be formed to be arranged as shown in FIGS. 1 and 3. In the plan view shown in FIG. 3, the projections 11 may be arranged at the surface on the c-plane (main surface) side (on the upper surface side in FIGS. 1 and 3) of the sapphire substrate 10 in the longitudinal direction (in the right-left direction of FIG. 3) of the projections 11 as well as in the width direction (in the up-down direction of FIG. 3) at predetermined intervals.

Specifically, as illustrated in FIG. 3, the projections 11 are respectively arranged at a predetermined interval in the row direction, which is the longitudinal direction of the elongated shape, as well as at another or the same predetermined interval in the column direction, which is the width direction of the elongated shape. Further, the projections 11 in the rows adjacent to each other in the column direction may be arranged to be displaced from the each other in the row direction. In other words, the projection 11 in one row and the projection 11 in the previous row in the column direction may be arranged to be displaced from each other in the row direction. That is, the projections 11 may be arranged such that the centers of the respective projections in the plan view are positioned at vertices of a triangular lattice. Note that the term "center of the above-mentioned projection 11" as used herein means a point at which the central line in the longitudinal direction of the projection 11 intersects the central line in the width direction thereof.

An interval (shortest distance) between the projections 11 is preferably in a range of, for example, 0.3 μm to 2 μm in the longitudinal direction and the width direction. The length in the longitudinal direction of the projection 11 and the length in the width direction thereof are preferably in a range of, for example, 1 μm to 15 μm, and 1 μm to 5 μm, respectively. The height of the projection 11 is preferably in a range of, for example, 0.5 μm to 2.5 μm. The number of the projections 11 is determined according to the area of the sapphire substrate 10, taking into consideration the interval between the projections 11 mentioned above, and the length of the projection 11. For example, the projections 11 are equally arranged across the entire surface of the sapphire substrate 10. The projection 11 preferably has the length thereof in the longitudinal direction that is twice or more as long as that thereof in the width direction.

The projection 11 is formed to have the elongated shape in a plan view as shown in FIGS. 4A and 4B. As illustrated in FIGS. 4A and 4B, the projection 11 may be formed to have both respective ends thereof in the longitudinal direction having the substantially same shape, and further may be formed to have both respective ends thereof having a semicircular shape in the plan view. As shown in FIGS. 4D and 4E, the projection 11 may be formed such that an upper part of a cross-section thereof in the width direction (cross-section parallel to the width direction) is not a flat surface but has a sharp shape (as illustrated in FIGS. 4D and 4E, the "sharp shape" can include a corner, which is apart in which a change of a curvature becomes discontinuous, for example). That is, the projection 11 may be formed to configure a sharp vertex of a triangle that extends from a predetermined position in height toward the vertex, at the cross-sectional shape in the width direction.

Here, in the case where the projection 11 has a cross-sectional shape with an upper flat surface, such as a trapezoidal shape, the nitride semiconductor also grows from the upper flat surface (c-plane). Since the nitride semiconductor growing from the upper surface hardly grow in the lateral direction, a plurality of dislocations generated in the growth direction do not converge, leading to an increase in dislocation density at the surface of the nitride semiconductor. On the other hand, as mentioned above, when the cross-sectional shape of the projection 11 does not have the upper flat surface, the growth from the upper part of the projection 11 is suppressed, causing the growth of the nitride semiconductor in the lateral direction. Thus, in the case of the projection 11 not having an upper flat surface, the plurality of dislocations generated in the growth direction can converge, so that the dislocation density thereof can be reduced.

In crystal growth, a relatively stable crystal plane tends to appear as a facet plane. Crystals of the hexagonal nitride semiconductor (e.g., GaN) are grown on the surface, as the facet plane, which is slightly inclined with respect to the a-plane of the nitride semiconductor. In the case where the tip end portion in the longitudinal direction of the projection 11 has a semicircular shape in the plan view, the respective facet planes can grow with substantially the same width, so that the nitride semiconductors can be grown toward the vicinity of the center of the semicircle, and can be bonded together in the vicinity of the center of the semicircle. The length in the longitudinal direction of the projection 11 is preferably twice or more as long as that in the width direction thereof. Thus, dislocations generated from c-plane regions (flat regions where the projections 11 are not formed) of the sapphire substrate 10 can progress in the lateral direction, which can decrease the number of threading dislocations appearing on the surface of the nitride semiconductor, as will be discussed below. The length in the longitudinal direction of the projection 11 is preferably not too long, so that the nitride semiconductors grown from both sides of the projection 11 can be easily bonded together on or above the projection 11. Specifically, the length in the longitudinal direction of the projection 11 is preferably 20 times or less as long as that in the width direction of the projection 11, and more preferably 10 times or less. From another viewpoint, the length in the longitudinal direction of the projection 11 is preferably one that does not substantially reach at least a length from one end of the main surface of the sapphire substrate 10 to the other end thereof, and more preferably, does not substantially reach a length from one end of the nitride semiconductor element to the other end thereof.

As shown in FIG. 3, an outer edge of the projection 11 (or a part substantially parallel to the longitudinal direction of the outer edge) in the longitudinal direction of the elongated shape in the plan view may extend in a first direction. The first direction means a direction that is oriented at an angle in a range of −10° to +10° with respect to the a-plane (see FIG. 2) of the above-mentioned sapphire substrate 10. Here, the a-plane can be any a-plane perpendicular to any one of an $a_1$-axis, an $a_2$-axis and an $a_3$-axis.

In this way, the projections 11 are formed on the sapphire substrate 10, whereby as indicated by a dashed arrow of FIG. 5A, the nitride semiconductor grows mainly from the c-plane of the sapphire substrate 10 (flat plane where the projections 11 are not formed) in crystal growth of the nitride semiconductor, and thus can also grow in the lateral direction so as to cause the grown crystals of the nitride semiconductor to be abutted against each other above each projection 11 (in other words, so as to bond the nitride semiconductors grown from different parts of the sapphire substrate together, above the projection 11).

Returning to FIG. 1, the structure of the nitride semiconductor element 1 will be subsequently described below. The buffer layer 20 is to relieve a difference in lattice constant between the sapphire substrate 10 and the nitride semiconductor grown on the sapphire substrate 10. The buffer layer 20 is formed between the sapphire substrate 10 and the nitride semiconductor layer 30. The buffer layer 20 is formed of, e.g., AlN. The buffer layer 20 can be formed, for example, by sputtering under predetermined conditions in a buffer layer formation step of the method for manufacturing a substrate for nitride semiconductor element, as will be discussed below. The buffer layer 20 takes the form of a layer, for example, that covers the sapphire substrate 10 as shown in FIG. 1. However, the sapphire substrate 10 may be partially exposed from the buffer layer 20.

In the case where the nitride semiconductor element 1 is a light emitting element, such as a LED chip, the nitride semiconductor layer 30 constitutes a light emitting portion. In this case, as shown in FIG. 1, the nitride semiconductor layer 30 is formed on the c-plane (main surface) of the sapphire substrate 10 via the buffer layer 20. The nitride semiconductor layer 30 may include a stacked structure of an n-type semiconductor layer 31, an active layer 32 and a p-type semiconductor layer 33 which are stacked from the bottom in this order. The active layer 32 has, for example, a quantum well structure including a well layer (light emitting layer) and a barrier layer.

The nitride semiconductor layer 30 includes GaN, AlN or InN, or a group III-V nitride semiconductor which is a mixed crystal of the above-mentioned materials (In$_X$Al$_Y$Ga$_{1-X-Y}$N (0≤X, 0≤Y, X+Y≤1)). The group-III element may use B (Boron) partially or as a whole. The group-V element may be a mixed crystal containing N, a part of which is substituted by P, As or Sb.

Referring to FIGS. 5A and 5B, the crystal growth and dislocations will be described below. In use of the flat sapphire substrate 10 without any projections 11, the nitride semiconductor cannot grow in the lateral direction. As mentioned above, when the projections 11 are formed on the sapphire substrate 10, the nitride semiconductor can also grow in the lateral direction during the growth of the nitride semiconductor. Since dislocations basically progress in the crystal growth direction, as shown in FIGS. 5A and 5B, the nitride semiconductor grows in the lateral direction toward above the projection 11, so that the dislocations in the nitride semiconductor also progress in the lateral direction toward above the projection 11. Then, the nitride semiconductors are bonded together above the projection 11, whereby the dislocations also converge above the projection 11. As a result, the dislocations on the surface of the final (uppermost) nitride semiconductor are reduced. In this way, the nitride semiconductors are gradually bonded together while keeping the facet plane exposed, which can also suppress the generation of new dislocations above the projection 11, thereby reducing the dislocation density of the nitride semiconductor layer 30. At this time, as shown in FIGS. 5A and 5B, the case where the time for the nitride semiconductor to expose the facet plane is longer (or the case where the thickness of the nitride semiconductor grown with the facet plane exposed is thicker) tends to cause the dislocations to converge, reducing the number of the dislocations. Note that referring to FIGS. 5A and 5B, the progressing direction of the dislocations in the lateral direction is one direction. However, the progressing direction of the dislocations can be changed in an intermediate stage. For example, in an early stage, the dislocations progress upward, and sometimes progress laterally or obliquely upward on the way.

The projection 11 is shaped such that its outer edge in the longitudinal direction extends in a direction oriented at the angle in the range of −10° to +10° with respect to the a-plane of the sapphire substrate 10, which can increase the time for the nitride semiconductors to be bonded together above the projection 11. Regarding this, GaN, which is one of the typical nitride semiconductors, will be described below by way of example.

Hexagonal crystals of GaN are grown with the c-axis direction set as the upward direction. As to the growth in the lateral direction, the crystals is less likely to be grown in them-axis direction rather than the a-axis direction, whereby the crystals tend to continuously grow while maintaining the facet plane that has as its bottom, a line of intersection between a surface equivalent to the a-plane of the GaN (surface perpendicular to the c-plane of the sapphire substrate 10), and the c-plane of the sapphire substrate 10 in the plan view. At this time, the a-plane of the GaN is positioned on the same plane as them-plane of the sapphire substrate 10. That is, GaN tends to be grown while maintaining the facet plane that has the line matching with the m-plane of the sapphire substrate 10 as the bottom in the plan view. On the surface of the sapphire substrate 10, the elongated projections 11 are disposed such that the outer edge of each projection in the longitudinal direction extends along the surface (typically, the a-plane) that is different from the m-plane of the sapphire substrate 10. Thus, the outer edge in the longitudinal direction of the projection 11 is not matched with the a-plane of the GaN, so that the bottom of the facet plane is non-parallel to the outer edge in the longitudinal direction of the projection 11.

As a result, the growth rate of GaN in the width direction of the projection 11 becomes slow, as compared to the case where the outer edge in the longitudinal direction of the projection 11 is matched with the a-plane of GaN, that is, the case where the bottom of the facet plane is in parallel with the outer edge in the longitudinal direction of the projection 11. Thus, the time required for the transverse growth over the projection 11 is increased, whereby the dislocations are more likely to converge, thus reducing the dislocation density. In the case where the direction (the a-axis direction) in which the nitride semiconductor can be readily grown is matched with the width direction of the projection 11, the nitride semiconductors grown from both sides of the projection 11 are bonded together from the front surface side, which might generate a new edge dislocation in bonding the nitride semiconductors. For this reason, it is considered that the width direction of the projection 11 is arranged to be displaced from the a-axis direction in which the nitride semiconductor can be readily grown, which can prevent generation of new edge dislocations when crystals of GaN are bonded together above the projection 11, without bonding the nitride semiconductors growing in the a-axis direction from the front surface side.

As mentioned above, in the nitride semiconductor element 1, the growth plane of the nitride semiconductor does not match with the outer edge in the longitudinal direction of the projection 11, whereby the nitride semiconductors are gradually bonded together from the vicinity of the tip end to converge into the vicinity of the center of the projection 11. Thus, as indicated by a thick line of FIG. 6A, the region where the dislocations remain in the plan view becomes small (narrow), and the dislocation density tends to be small. On the other hand, for example, as shown in FIG. 6B, if an outer edge in the longitudinal direction of a projection 111 does not extend in a direction oriented at the angle in the range of −10° to +10° with respect to the a-plane of the sapphire substrate 10 (for example, extends in the direction perpendicular to the first direction), the outer edge in the longitudinal direction of the projection 111 is substantially matched with the growth plane of the nitride semiconductor. As a result, the nitride semiconductors are bonded together substantially at the same time near the center line in the longitudinal direction of the projection 111, and cannot grow in the lateral direction any more. Thus, as indicated by a thick line of FIG. 6B, the region where the dislocations remain in the plan view becomes large (wide), so that the dislocation density tends to be large.

Next, FIGS. 7A to 7D illustrate examples in which GaN is grown on the sapphire substrate with the elongated projections formed thereon. FIGS. 7A to 7D are exemplary diagrams made based on images taken by a scanning electron microscope (SEM), showing the state of GaN grown on the buffer layer formed on the sapphire substrate. Each of the projection 11 and the projection 111 has a length in the longitudinal direction of about 10 μm, a length in the width direction of about 2.6 μm, and a height of about 1.4 μm. FIGS. 7A and 7B illustrate the examples in which the outer edge in the longitudinal direction of the projection 11 extends in the direction of the a-plane of the sapphire substrate. The thickness of the GaN is about 0.5 μm in FIG. 7A, and about 1.5 μm in FIG. 7B. Regions enclosed by thick lines in the figures and extending in the lateral direction of the figure correspond to the projections 11, and any other regions except for these regions correspond to GaN. As shown in FIG. 7B, in this example, the outer edge in the longitudinal direction of the projection 11 is not matched with the growth plane of the GaN. Thus, while GaN starts to be bonded together at the tip end of the projection 11, a distance between the facets of GaN is still large in the vicinity of the center of the projection 11, and the interval between the facets of GaN is not constant. If such GaN further grows, the GaN crystals are gradually bonded together from the vicinity of the tip end of the projection 11, and then converge near the center of the projection 11.

On the other hand, FIGS. 7C and 7D show examples in which the outer edge in the longitudinal direction of the projection 111 extends in the m-plane direction of the sapphire substrate. The thickness of GaN is about 0.5 μm in FIG. 7C, and about 1.5 μm in FIG. 7D. As shown in FIG. 7D, in this example, the outer edge in the longitudinal direction of the projection 111 is matched with the growth surface of GaN, so that GaN grows from both sides in the longitudinal direction of the projection 111 substantially in parallel to the projection, which results in a substantially constant interval between the facets of the GaN crystals. As such GaN further grows, the GaN crystals grown from both sides are bonded together in the vicinity of the center line in the longitudinal direction of the projection 111 substantially at the same time.

The nitride semiconductor element 1 with the structure mentioned above in the first embodiment includes the nitride semiconductor layer 30 having a low dislocation density and grown from the sapphire substrate 10 with the elongated projections 11, and thus can improve temperature characteristics of the nitride semiconductor element 1. Here, the improvement of the temperature characteristics means that the degree of the change in light output obtained when the atmospheric temperature is increased is small. For example, in the case where the nitride semiconductor element 1 has its light output set to 1 upon being driven under an ordinary temperature atmosphere (e.g., 25° C.), the light output from the nitride semiconductor element 1 is lower than 1 when the nitride semiconductor element is driven under a high temperature atmosphere (e.g., 100° C.). The improvement of the temperature characteristics means that the degree of the decrease in light output is small. Such improvement of the temperature characteristics is considered to be achieved by reduction in the trapping of electrons that would be caused by the dislocations, because of the decrease in dislocation density. In more detail, it is considered that the dislocation density of, especially, the active layer 32 of the nitride semiconductor layer 30 becomes low, thereby improving the temperature characteristics. The dislocation density of the active layer 32 can be determined by the density of dislocations appearing on the surface of the n-type semiconductor layer 31 as an underlayer. For this reason, particularly, the dislocation density of the surface of the n-type semiconductor layer 31 is preferably decreased.

[Method for Manufacturing Nitride Semiconductor Element]

A method for manufacturing a nitride semiconductor element 1 according to the first embodiment of the present invention will be described with reference to FIGS. 8A to 8F and FIGS. 9A to 9F. The method for manufacturing a nitride semiconductor element 1 which is a LED chip will be described below.

First, a method for manufacturing a substrate for a nitride semiconductor element will be described. The method for manufacturing a substrate for a nitride semiconductor element includes a mask formation step shown in FIGS. 8A and 8B, and an etching step shown in FIGS. 8C to 8F, which are performed in this order. FIGS. 8A and 8B illustrate the same step when observed from different points of view. The same goes for FIGS. 8C and 8D; and FIGS. 8E and 8F. FIGS. 8A, 8C and 8E are cross-sectional views observed from the side surface. FIGS. 8B, 8D and 8F are cross-sectional views observed from the front surface. The cross-sectional view observed from the side surface is a cross-sectional view observed from the side surface of the projection 11 in the longitudinal direction (side surface parallel to the longitudinal direction thereof), and the cross-sectional view observed from the front surface is a cross-sectional view observed from a direction perpendicular to the longitudinal direction.

In the mask formation step, a mask is provided on the sapphire substrate 10. In the mask formation step, specifically, as shown in FIGS. 8A and 8B, for example, a $SiO_2$ film is deposited on the surface of the c-plane side of the flat-plate shaped sapphire substrate 10, and then patterned to form a plurality of elongated masks M covering regions for formation of the projections 11.

In the etching step, the sapphire substrate 10 is etched. Specifically, in the etching step, as shown in FIGS. 8C to 8F, the sapphire substrate 10 with the masks M disposed thereon can be dry-etched to form a plurality of projections 11 at the surface on the c-plane side of the sapphire substrate 10, each projection having an elongated shape in the plan view. The outer edge in the longitudinal direction of the elongated projection is positioned at the angle in the range of −10° to +10° with respect to the a-plane of the sapphire substrate 10. In the case where the etching is performed using material that cannot be etched as a mask material, the mask with an elongated shape is used to perform the etching, thereby producing the projection 11 whose upper part is flat-shaped in the front view (that is, as observed in the same direction as each of FIGS. 8B, 8D and 8F). In this embodiment, however, the use of the material that can be etched for the masks M allows the masks M on the sapphire substrate 10 to be etched in the first etching step. Each mask M is gradually etched not only from its upper surface, but also from its side surface, whereby the diameter of the mask M becomes smaller. As a result, the projection 11 is formed by being etched on the sapphire substrate 10 in the dome shape, such as a semispherical shape, while the upper part of the projection 11 has its sharp upper end in the front view. If the projection 11 has a shape with a flat upper surface (c-plane), the nitride semiconductor will start growing from the upper surface. For this reason, the projection 11 preferably has a shape without having a flat upper surface, such as the semispherical shape.

Specifically, suitable dry etching methods can include, for example, gas-phase etching, plasma etching, reactive ion etching, and the like. At this time, examples of an etching gas can include $Cl_2$, $SiCl_4$, $BCl_3$, HBr, $SF_6$, $CH_4$, $CH_2F_2$, $CHF_3$, $C_4F_8$, $CF_4$, etc., and an inert gas such as Ar.

Next, the method for manufacturing a nitride semiconductor element 1 will be described. The method for manufacturing a nitride semiconductor element 1 includes, after the method for manufacturing a substrate for nitride semiconductor element (see FIGS. 8A to 8F) as mentioned above, a buffer layer formation step shown in FIG. 9A, and a semiconductor layer growth step shown in FIG. 9B, which are performed in this order. FIGS. 9A, 9D and 9E differ from FIGS. 9B and 9C in point of view. FIGS. 9A, 9D and 9E are cross-sectional views observed from the side surface. FIGS. 9B and 9C are cross-sectional views observed from the front surface.

The nitride semiconductor element 1 may be manufactured by performing a substrate preparation step of preparing the sapphire substrate 10 with the elongated projections 11 shown in FIGS. 8E and 8F in advance by a different method from the above-mentioned method for manufacturing a substrate for nitride semiconductor element (see FIGS. 8A to 8F), a buffer layer formation step shown in FIG. 9A after the substrate preparation step, and semiconductor layer growth steps shown in FIGS. 9B to 9D in this order.

In the buffer layer formation step, the buffer layer 20 is formed on the sapphire substrate 10. Specifically, as shown in FIG. 9A, in the buffer layer formation step, the buffer layer 20 is deposited on the sapphire substrate 10 with the projections 11 formed thereat, for example, by sputtering. The buffer layer formation step can be omitted, but is preferably performed. The buffer layer 20 takes the form of a layer, for example, that covers the sapphire substrate 10 as shown in FIG. 9A. However, the sapphire substrate 10 may be partially exposed from the buffer layer 20.

In the semiconductor layer growth step, the nitride semiconductor layer 30 is grown over the surface of the sapphire substrate 10 with the projections 11 formed thereat, thereby forming a light emitting element structure. In the semiconductor layer growth step, specifically, as shown in FIGS. 9B to 9D, crystals of the n-type semiconductor layer 31 are grown on the c-plane side surface of the sapphire substrate 10 with the projections 11 formed thereat, via the buffer layer 20. At this time, as shown in FIGS. 9B and 9C, the n-type semiconductor layer 31 is grown from the region between the respective projections 11 in the upward and lateral directions to cover the projections 11. Until the projections 11 are completely covered, the nitride semiconductor constituting the n-type semiconductor layer 31 is grown while maintaining an oblique growth plane (facet plane) with respect to the surface of the sapphire substrate 10. Subsequently, an active layer 32 is grown on the n-type semiconductor layer 31, and then a p-type semiconductor layer 33 is grown thereon, thereby forming the light emitting element structure including the active layer 32. Note that the undoped nitride semiconductor layer may be grown without intentionally adding impurities until the adjacent nitride semiconductors are bonded together above the projection 11, and then n-type impurities may be added to grow an n-type nitride semiconductor layer. The nitride semiconductor made of GaN further preferably grows at least until crystals of the nitride semiconductors are bonded together above the projection 11. Instead of the light emitting element structure, another element structure, such as a field-effect transistor, can also be formed.

Through the steps mentioned above, the nitride semiconductor element 1 shown in FIG. 9D, can be manufactured. Next, a specific example in which the nitride semiconductor element 1 is a semiconductor light emitting element (LED chip) will be described with reference to FIGS. 9E and 9F. A nitride semiconductor element 2 shown in FIGS. 9E and 9F includes the sapphire substrate 10 with the projections 11, and the n-type semiconductor layer 31, the active layer 32 and the p-type semiconductor layer 33 which are formed over the substrate. The n-type semiconductor layer 31 is partially exposed to provide an n electrode 40, and a full-surface electrode 50 and a p electrode 60 are provided over the surface of the p-type semiconductor layer 33. After the above-mentioned semiconductor layer growth step, an electrode formation step can be performed to manufacture the nitride semiconductor element with these electrodes. That is, as shown in FIGS. 9E and 9F, first, some regions of the p-type semiconductor layer 33 and the active layer 32 are removed by dry etching and the like to expose apart of the n-type semiconductor layer 31. Then, the n electrode 40 is formed on the exposed n-type semiconductor layer 31, the full-surface electrode 50 is formed on the p-type semiconductor layer 33, and the p electrode 60 is formed on the full-surface electrode 50, so that the nitride semiconductor element 2 shown in FIGS. 9E and 9F can be manufactured. Note that after the semiconductor layer growth step, a singulation step may be performed, in which the above-mentioned light emitting element structure and sapphire substrate 10 are divided and singulated into individual light emitting elements. In this case, the electrode formation step may be performed after the semiconductor layer growth step and before the singulation step.

In this way, in the method for manufacturing a nitride semiconductor element 1, the outer edge in the longitudinal direction of the projection 11 formed on the sapphire substrate 10 extends to be positioned at the angle in the range of −10° to +10° with respect to the a-plane of the sapphire substrate 10, which will take a long time for the nitride semiconductor to be grown in the lateral direction during the crystal growth of the nitride semiconductor. For this reason, the dislocations generated in the crystal growth of the nitride semiconductor tend to converge in the narrow range, reducing the dislocation density of the nitride semiconductor layer 30. Thus, the temperature characteristics of the nitride semiconductor element 1 can be improved.

Although the nitride semiconductor element and the manufacturing method thereof according to the embodiments of the present invention have been specifically described by referring to the embodiments for implementing the present invention, the spirit of the present invention (or the scope of the present invention) is not limited to the above description, and must be broadly interpreted based on the descriptions of the accompanied claims. It is obvious that various modifications and changes can be made to the description of these embodiments within the spirit of the present invention (or the scope of the present invention).

For example, the sapphire substrate 10 of the above-mentioned nitride semiconductor element 1 has the elongated projections 11 arranged thereon as shown in FIG. 3. However, the arrangement of the projection 11 is not limited thereto. Other forms of arrangement of the projections 11 in the nitride semiconductor element will be described below. The nitride semiconductor element according to other embodiments mentioned below has a structure similar to the nitride semiconductor element 1 in the first embodiment as to the specific structure of the projection 11 (see FIG. 4), the manufacturing method of the nitride semiconductor element (see FIG. 8), and the structure except for the sapphire substrate 10 (see FIG. 1), and thus a description thereof will be omitted below.

Second Embodiment

As illustrated in the plan view of FIG. 10, the projections 11 of a nitride semiconductor element according to a second embodiment are arranged at the surface on the c-plane side of a sapphire substrate 10A in the longitudinal direction (in the right-left direction of FIG. 10) of the projections 11 as well as in the width direction (in the up-down direction of FIG. 10) at respective predetermined intervals. Specifically, as illustrated in FIG. 10, the projections 11 are arranged at the respective predetermined intervals in the row direction, which is the longitudinal direction of the elongated shape, as well as in the column direction, which is the width direction of the elongated shape. Further, the projections 11 belonging to the rows adjacent to each other in the column direction may be arranged to be located in the same position in the row direction, and the projections 11 belonging to the columns adjacent to each other in the row direction may be arranged to be displaced from each other in the column direction. In other words, the projection 11 in one row and the projection 11 in the previous row may be arranged to be aligned with each other in the row direction, and the projections 11 are arranged such that the projection 11 in one column and the projection 11 in the previous column may be displaced from each other in the row direction. That is, the projections 11 are arranged such that the centers thereof are positioned at the vertexes of a triangular lattice in the plan view.

As shown in FIG. 10, an outer edge of the projection 11 in the longitudinal direction of the elongated shape in the plan view may extend in a first direction. The first direction means a direction oriented at an angle in a range of −10° to +10° with respect to the a-plane of the above-mentioned sapphire substrate 10A.

In the nitride semiconductor element with the structure mentioned above in the second embodiment, as the outer edge in the longitudinal direction of the projection 11 formed on the sapphire substrate 10A extends to be positioned at the angle in the range of −10° to +10° with respect to the a-plane of the sapphire substrate 10A, a long time is taken for the nitride semiconductor to be grown in the lateral direction during the crystal growth of the nitride semiconductor. As a result, the dislocations generated in the crystal growth of the nitride semiconductor tend to converge in the narrow range, reducing the dislocation density of the nitride semiconductor layer 30. Therefore, the nitride semiconductor element in the second embodiment can include the nitride semiconductor layer 30 having a low dislocation density, so that the temperature characteristics can be improved.

Third Embodiment

As illustrated in the plan view of FIG. 11, in a nitride semiconductor element according to a third embodiment, the projections 11 are arranged at the surface on the c-plane side of a sapphire substrate 10B at respective predetermined intervals in directions having different angles while the outer edges in the longitudinal direction of the projections 11 faces each other. Specifically, the projections 11 include a first group of projections (a first group) 11A, in which each of outer edges in the longitudinal direction of the elongated shape of the projections 11 extends in the first direction, and a second group of projections (a second group) 11B, in which each of outer edges in the longitudinal direction of the elongated shape of the projections 11 extends in a second or third direction (the nitride semiconductor element of the third embodiment may include the first group of projections 11A and the second group of projections 11B).

Here, the first, second and third directions mean the following directions. The first direction is a direction oriented at an angle in a range of −10° to +10° with respect to the a-plane whose normal line is a first a-axis (e.g., $a_1$-axis) as one of an $a_1$-axis, an $a_2$-axis and an $a_3$-axis of the above-mentioned sapphire substrate 10B (see FIGS. 2A and 2B). The second direction is a direction oriented at an angle in a range of −10° to +10° with respect to the a-plane whose normal line is a second a-axis (e.g., $a_2$-axis) different from the first a-axis, as one of an $a_1$-axis, an $a_2$-axis and an $a_3$-axis of the above-mentioned sapphire substrate 10B (see FIGS. 2A and 2B). The third direction is a direction oriented at an angle in a range of −10° to +10° with respect to the a-plane whose normal line is a third a-axis (e.g., $a_3$-axis) different from the first and second a-axes, as one of an $a_1$-axis, an $a_2$-axis and an $a_3$-axis of the above-mentioned sapphire substrate 10B (see FIGS. 2A and 2B).

Note that the outer edge of each of projections 11 of the second group of projections 11B in the longitudinal direction of the elongated shape may extend in either the second or third direction, but extends in the second direction byway of example in this figure.

As shown in FIG. 11, in the nitride semiconductor element in the third embodiment, the projections (second projections) 11 included in the second group of projections 11B are arranged in a direction different from a direction of the projections (first projections) 11 included in the first group of projections, on respective extended lines in the longitudinal direction of the projections 11 included in the first group of projections 11A. Further, the projections (first projections) 11 included in the first group of projections 11A are arranged in a direction different from a direction of the projection 11 (second projections) included in the second group of projections, on respective extended lines in the longitudinal direction of the projections 11 included in the second group of projections 11B. Here, in the case where all the projections 11 are aligned in the same direction, like the nitride semiconductor element in the first and second embodiments, light leaks from the lateral side of the projection 11 along the direction in which the projection 11 extends upon emission of the light, resulting in the light distribution characteristics in the form of batwing that has the strong light emission in the oblique direction in some cases. On the other hand, as mentioned above, by arranging other projections 11 (other projections 11 with a different longitudinal direction) on the respective extended lines in the longitudinal direction of the projections 11, such leak of the light can be suppressed to produce the light distribution characteristics close to lambertian.

In the nitride semiconductor element with the structure mentioned above in the third embodiment, the outer edges in the longitudinal direction of the projections 11 included in each group of projections disposed on the sapphire substrate 10B extend to be positioned at an angle in a range of −10° to +10° with respect to any one of the a-planes each of whose normal lines is one of the $a_1$-axis, $a_2$-axis and $a_3$-axis of the sapphire substrate 10B (the whole first group of projections 11A and second group of projections 11B include the projections 11 that extend to form the angle in the range of −10° to +10° with respect to the respective two of the three a-planes). With such a structure, it will take a long time for the nitride semiconductor to be grown in the lateral direction during the crystal growth of the nitride semiconductor. Accordingly, the dislocations generated in the crystal growth of the nitride semiconductor tend to converge in the narrow range, reducing the dislocation density of the nitride semiconductor layer 30. Thus, the nitride semiconductor element in the third embodiment includes the nitride semiconductor layer 30 having a low dislocation density, so that the temperature characteristics can be improved.

Fourth Embodiment

As illustrated in the plan view of FIG. 12, projections 11 in a nitride semiconductor element according to a fourth embodiment are arranged at the surface on the c-plane side of a sapphire substrate 10C at respective predetermined intervals in three different directions. Specifically, the projections 11 include a first group of projections 11A, in which each of outer edges in the longitudinal direction of the elongated shape of the projections 11 extends in the first direction, a second group of projections 11B, in which each of outer edges in the longitudinal direction of the elongated shape of the projections 11 extends in a second direction, and a third group of projections 11C, in which each of outer edges in the longitudinal direction of the elongated shape of the projections 11 extends in a third direction (the nitride semiconductor element of the fourth embodiment may include the first group of projections 11A, the second group of projections 11B and the third group of projections 11C). The terms "first direction", "second direction" and "third direction" as used herein mean the same as those of the third embodiment mentioned above.

As shown in FIG. 12, in the substrate for nitride semiconductor element in the fourth embodiment, the projections 11 (second projections) included in the second group of projections 11B are arranged in a direction different from a direction of the projections 11 (first projections) included in the first group of projections, on respective extended lines in the longitudinal direction of the projections 11 included in the first group of projections 11A. Further, the projections 11 (third projections) included in the third group of projections 11C are arranged in a direction different from the direction of the projections 11 (second projections) included in the second group of projections, on respective extended lines in the longitudinal direction of the projections 11 included in the second group of projections 11B. Moreover, the projections 11 (first projections) included in the first group of projections 11A are arranged in a direction different from the direction of the projections 11 (third projections) included in the third group of projections, on respective extended lines in the longitudinal direction of the projections 11 included in the third group of projections 11C. In this way, by arranging other projections 11 with their angles changed from the projections already set, on the respective extended lines in the longitudinal direction of the projections 11, the leak of the light can be further suppressed to produce the light distribution characteristics closer to the lambertian.

For example, as shown in FIG. 12, the first group of projections 11A, the second group of projections 11B and the third group of projections 11C can be arranged to position the same number of projections 11 in each of the projection groups 11A, 11B and 11C so as to set the projections 11 in each group parallel to each other, and to have rotational symmetry around a predetermined point of the sapphire substrate 100 serving as the rotation center. The fact that the projections 11 in another projection group (for example, the projections 11 included in the second group of projections 11B) are arranged on the respective extended lines in the longitudinal direction of the previous projections 11 (for example, the projections 11 included in the first group of projections 11A) does not necessarily mean that these projections 11 in the groups are adjacent to each other. For example, first, on the corresponding extended line in the longitudinal direction of each of the projections 11 included in the first group of projections 11A, each of the projections 11 included in another first group of projections 11A can be disposed. Then, on the corresponding extended line in the longitudinal direction of each of these projections 11 arranged in another first group, each of the projections 11 included in the second group of projections 11B can be disposed. The number of the projections 11 continuously disposed in the same projection group is preferably 10 or less, and more preferably 5 or less.

In the nitride semiconductor element with the structure mentioned above in the fourth embodiment, the outer edges in the longitudinal direction of the projections 11 included in each group of projections disposed on the sapphire substrate 10C extend to be positioned at an angle in a range of −10° to +10° with respect to one of the three a-planes each of whose normal lines is one of the $a_1$-axis, $a_2$-axis and $a_3$-axis of the sapphire substrate 100 (the whole first group of projections 11A, second group of projections 11B and third group of projections 11C include the projections 11 that extend to form the angle in the range of −10° to +10° with respect to the respective three a-planes). With such a structure, it will take a long time for the nitride semiconductor to be grown in the lateral direction during the crystal growth of the nitride semiconductor. Accordingly, the dislocations generated in the crystal growth of the nitride semiconductor tend to converge in the narrow range, reducing the dislocation density of the nitride semiconductor layer 30. Thus, the nitride semiconductor element in the fourth embodiment can include the nitride semiconductor layer 30 having a low dislocation density, so that the temperature characteristics can be improved.

In the sapphire substrates 10 to 100 of the nitride semiconductor elements according to the first to fourth embodiments mentioned above, the elongated projections 11 are formed in the substantially same shape with both ends of each elongated projection 11 having a semicircular shape. However, the shape of the projection 11 is not limited thereto. Other forms of the shape of the projection 11 in the nitride semiconductor element will be described below. The nitride semiconductor element according to other embodiments mentioned below may have the same structure as that of the nitride semiconductor element in the first embodiment, except for the sapphire substrate 10 (see FIG. 1), and thus a description thereof will be omitted below.

Fifth Embodiment

[Structure of Nitride Semiconductor Element]

As shown in FIGS. 13A and 13B, a projection 12 in a nitride semiconductor element according to a fifth embodiment is formed in an elongated shape in the plan view. As illustrated in FIGS. 13A and 13B, the projection 12 has an outer appearance of the bottom surface with a straight line and a curved line. The projection 12 is formed to protrude upward from its bottom and to be sharpened from a predetermined position in the height direction to have an acute angle with respect to a ridge line. Thus, like the above-mentioned projection 11, the crystal growth from the top of the projection 12 is suppressed during the crystal growth of the nitride semiconductor, allowing the nitride semiconductor to be grown in the lateral direction, whereby dislocations generated in the growth direction can converge to reduce the number of the dislocations.

As shown in FIGS. 13A and 13B, the projection 12 has substantially the same bottom shape as that in each of the first to fourth embodiments, but differs in shape of the vicinity of the top thereof. The shape of the vicinity of the top of the projection 12 is formed such that the upper part of its cross-section in the width direction is not flat-shaped but sharpened as shown in FIGS. 13C to 13E. Further, as shown in FIGS. 13D to 13F, the projection 12 is formed to have its upper part of the cross-section in the width direction formed in a triangle shape, and its lower part thereof rounded off. The projection 12 can be formed by dry etching a sapphire substrate 10D under predetermined conditions in a first etching step of the method for manufacturing a substrate for nitride semiconductor element, and further by wet etching the sapphire substrate 10D under predetermined conditions in a second etching step, as will be discussed below.

As shown in FIGS. 13B to 13F, the projection 12 is provided with a first inclined surface 121a and a second inclined surface 121b that are inclined at one end side in the longitudinal direction of its elongated shape toward the top of the projection, and a third inclined surface 121c that is inclined at the other end side in the longitudinal direction of its elongated shape toward the top of the projection. As shown in FIGS. 13B to 13F, the projection 12 is provided with a fourth inclined surface 121d that is inclined at an upper part on one end side in the width direction of its elongated shape toward the top of the projection, and a fifth inclined surface 121e that is inclined at an upper part of the other end side in the width direction of its elongated shape toward the top of the projection. The angle formed by these inclined surfaces 121a, 121b, 121c, 121d and 121e with respect to the c-plane of the sapphire substrate 10D is preferably in a range of, for example, 20° to 50°, and more preferably, 30° to 40°.

The projections 12 with the above-mentioned structure can be arranged, for example, in the same way as that in each of the first to third embodiments. Alternatively, as shown in FIG. 14, the projections 12 can be arranged on the sapphire substrate 10D in the same way as that in the above-mentioned fourth embodiment (see FIG. 12). That is, as illustrated in the plan view of FIG. 14, the projections 12 in a nitride semiconductor element according to a fifth embodiment are arranged at the surface on the c-plane side of the sapphire substrate 10D at respective predetermined intervals in three different directions. Specifically, the projections 12 include a first group of projections 12A, in which each projection 12 has an elongated shape and longitudinal direction thereof extends in the first direction, a second group of projections 12B, in which each projection 12 has an elongated shape and longitudinal direction thereof extends in the second direction, and a third group of projections 12C, in which each projection 12 has an elongated shape and longitudinal direction thereof extends in the third direction.

In the nitride semiconductor element with the structure mentioned above in the fifth embodiment, the outer edges in the longitudinal direction of the projections 12 included in each group of projections disposed on the sapphire substrate 10D extend to be positioned at an angle in a range of −10° to +10° with respect to the three a-planes, each of which has as a normal line, one of the $a_1$-axis, $a_2$-axis and $a_3$-axis of the sapphire substrate 10D. Further, the nitride semiconductor element includes the first to fifth inclined surfaces 121a to 121e where nitride semiconductor is hard to be grown on the projections 12. As a result, the nitride semiconductor element can suppress the unnecessary crystal growth from above the projections 12 during the crystal growth of the nitride semiconductor, and thus will take a long time for the nitride semiconductor to be grown in the lateral direction. The dislocations generated in the crystal growth of the nitride semiconductor tend to converge in the narrow range, reducing the dislocation density of the nitride semiconductor layer 30. Thus, the nitride semiconductor element in the fifth embodiment includes the nitride semiconductor layer 30 having a low dislocation density, so that the temperature characteristics can be improved.

[Method for Manufacturing Nitride Semiconductor Element]

A method for manufacturing a nitride semiconductor element according to the fifth embodiment of the present invention will be described below with reference to the accompanying drawings. First, the method for manufacturing a substrate for nitride semiconductor element will be described. The method for manufacturing a substrate for nitride semiconductor element may include a mask formation step, a first etching step and a second etching step which may be performed in this order. The mask formation step is similar to the mask formation step mentioned in the first embodiment, and the first etching step is similar to the etching step mentioned in the first embodiment.

In the second etching step, the sapphire substrate 10D is further etched after the first etching step. Specifically, in the second etching step, the sapphire substrate 10D with the projections 12, each having its both ends formed in the semicircular shape in the plan view in the first etching step, is subjected to wet etching. Thus, this step forms the first inclined surface 121a and second inclined surface 121b that are inclined on one end side in the longitudinal direction of the projection 12 toward the top of the projection, as well as the third inclined surface 121c that is inclined on the other end side in the longitudinal direction of the projection 12 toward the top of the projection. Moreover, in the second etching step, the wet etching progresses from the tip ends of both ends of the projection 12 having a semicircular shape in the front view during the wet etching process, whereby the projection 12 is formed to be into a triangular cross-sectional shape which is sharpened toward a ridge line as the top thereof.

Suitable etchants for the wet etching can include, for example, phosphoric acid, pyrophosphoric acid, or a mixed acid prepared by adding sulfuric acid to the above-mentioned acid, or potassium hydrate. Conditions for the wet etching are preferably as follows: for example, a temperature of the etchant of 150° C. to 300° C., and an immersion time of 1 minute to 60 minutes. That is, in the second etching step, the wet etching is performed to form the inclined surfaces 121a, 121b, 121c, 121d and 121e within a desired range.

The shape of the bottom surface of the projection 12 preferably has both ends thereof with a semicircular shape in the plan view. The wet etching tends to start from removing the top of the projection 12, so that the first inclined surface 121a, second inclined surface 121b and third inclined surface 121c extends from the top toward the bottom side together with the progress of the wet etching. Thus, in order to keep the shape of the bottom surface of each of both ends of the projection 12 semicircular, the etching should be stopped before the first to third inclined surfaces 121a to 121c reach the bottom surface of the projection 12. In the case where the etching progresses until the first to third inclined surfaces 121a to 121c reach the bottom surface of the projection 12, one end in the longitudinal direction of the elongated shape of the projection can be formed to be sharpened toward the longitudinal direction, and the other end in the longitudinal direction thereof can be formed in a quadrilateral cross-sectional shape. The same shape can be obtained by performing only wet etching after the mask formation step, instead of the first and second etching steps.

In the above-mentioned method for manufacturing a nitride semiconductor element 1 according to the first embodiment, the sapphire substrate 10D is used instead of the sapphire substrate 10 to be capable of manufacturing the nitride semiconductor element.

DESCRIPTION OF REFERENCE NUMERALS 1, 2 Nitride semiconductor element
10, 10A, 10B, 10C, 10D Sapphire substrate (substrate for nitride semiconductor element)
11, 12, 111 Projection
11A, 12A First group of projections
11B, 12B Second group of projections
11C, 12C Third group of projections 121a First inclined surface
121b Second inclined surface
121c Third inclined surface
121d Fourth inclined surface
121e Fifth inclined surface
20 Buffer layer
30 Nitride semiconductor layer
31 N-type semiconductor layer
32 Active layer
33 p-type semiconductor layer
40 n electrode
50 Full-face electrode
60 p electrode
M Mask
SC Sapphire crystal

What is claimed is:

1. A nitride semiconductor element comprising:
  a sapphire substrate comprising:
    a main surface extending in a c-plane of the sapphire substrate, and
    a plurality of projections that are made of sapphire and disposed at the main surface, each of the plurality of projections having an elongated shape in a plan view; and
  a nitride semiconductor layer disposed on the main surface of the sapphire substrate,
  wherein each projection has an outer edge extending in a longitudinal direction of the elongated shape, the outer edge extending in a direction oriented at an angle in a range of −10° to +10° with respect to an a-plane of the sapphire substrate in the plan view.

2. The nitride semiconductor element according to claim 1, wherein a length of each projection in the longitudinal direction is twice or more as long as a width of each respective projection in a width direction that is perpendicular to the longitudinal direction.

3. The nitride semiconductor element according to claim 1, wherein an upper part of each projection, in a cross-section parallel to a width direction that is perpendicular to the longitudinal direction, has a pointed shape.

4. The nitride semiconductor element according to claim 1, wherein a tip end portion of each projection, in the longitudinal direction, has a semicircular shape in the plan view.

5. The nitride semiconductor element according to claim 1,
  wherein the projections are arranged at respective predetermined intervals in a row direction and in a column direction, the row direction being the longitudinal direction of the elongated shape, and the column direction being a width direction of the elongated shape, which is perpendicular to the longitudinal direction, and
  wherein the projections in rows that are adjacent to each other in the column direction are displaced from each other in the row direction.

6. The nitride semiconductor element according to claim 1,
  wherein the projections are arranged at respective predetermined intervals in a row direction and in a column direction, the row direction being the longitudinal direction of the elongated shape, and the column direction being a width direction of the elongated shape, which is perpendicular to the longitudinal direction, and
  wherein the projections in rows that are adjacent to each other in the column direction are aligned in the row direction.

7. The nitride semiconductor element according to claim 1, wherein the sapphire substrate includes:
  a first group including first projections, each of the first projections having an outer edge in a longitudinal direction of the elongated shape of the projections extending in a direction oriented at an angle in the range of −10° to +10° with respect to the a-plane whose normal line is a first a-axis of the sapphire substrate; and
  a second group including second projections, each of the second projections having an outer edge in the longitudinal direction of the elongated shape of the projections extending in a direction oriented at an angle in the range of −10° to +10° with respect to the a-plane whose normal line is a second a-axis that is different from the first a-axis of the sapphire substrate.

8. The nitride semiconductor element according to claim 7, wherein:
  the second projections included in the second group are arranged on respective extended lines in the longitudinal direction of the first projections included in the first group, and
  the first projections included in the first group are arranged on respective extended lines in the longitudinal direction of the second projections included in the second group.

9. The nitride semiconductor element according to claim 1, wherein the sapphire substrate includes:
  a first group including first projections, each of the first projections having an outer edge in a longitudinal direction of the elongated shape of the projections extending in a direction oriented at an angle in a range of −10° to +10° with respect to the a-plane whose normal line is a first a-axis of the sapphire substrate;
  a second group including second projections, each of the second projections having an outer edge in the longitudinal direction of the elongated shape of the projections extending in a direction oriented at an angle in a range of −10° to +10° with respect to the a-plane whose normal line is a second a-axis that is different from the first a-axis of the sapphire substrate; and
  a third group including third projections, each of the third projections having an outer edge in the longitudinal direction of the elongated shape of the projections extending in a direction oriented at an angle in a range of −10° to +10° with respect to the a-plane whose normal line is a third a-axis that is different from the first a-axis and the second a-axis of the sapphire substrate.

10. The nitride semiconductor element according to claim 9, wherein:
  the second projections included in the second group are arranged on respective extended lines in the longitudinal direction of the first projections included in the first group,
  the third projections included in the third group are arranged on respective extended lines in the longitudinal direction of the second projections included in the second group, and
  the first projections included in the first group are arranged on respective extended lines in the longitudinal direction of the third projections included in the third group.

11. A nitride semiconductor element, comprising:
a sapphire substrate comprising:
- a main surface extending in a c-plane of the sapphire substrate, and
- a plurality of projections disposed at the main surface, each of the plurality of projections having an elongated shape in a plan view; and a nitride semiconductor layer disposed on the main surface of the sapphire substrate,
wherein the sapphire substrate includes:
- a first group including first projections, each of the first projections having an outer edge in a longitudinal direction of the elongated shape of the projections extending in a direction oriented at an angle in a range of −10° to +10° with respect to the a-plane whose normal line is a first a-axis of the sapphire substrate;
- a second group including second projections, each of the second projections having an outer edge in the longitudinal direction of the elongated shape of the projections extending in a direction oriented at an angle in a range of −10° to +10° with respect to the a-plane whose normal line is a second a-axis that is different from the first a-axis of the sapphire substrate; and
- a third group including third projections, each of the third projections having an outer edge in the longitudinal direction of the elongated shape of the projections extending in a direction oriented at an angle in a range of −10° to +10° with respect to the a-plane whose normal line is a third a-axis that is different from the first a-axis and the second a-axis of the sapphire substrate.

12. The nitride semiconductor element according to claim 11, wherein a length of each projection in the longitudinal direction is twice or more as long as a width of each respective projection in a width direction that is perpendicular to the longitudinal direction.

13. The nitride semiconductor element according to claim 11, wherein a length of each projection in the longitudinal direction is 20 times or less as long as a width of each respective projection in a width direction that is perpendicular to the longitudinal direction.

14. The nitride semiconductor element according to claim 11, wherein the nitride semiconductor layer includes a stacked structure of an n-type semiconductor layer, an active layer and a p-type semiconductor layer.

15. The nitride semiconductor element according to claim 14, wherein the active layer has a quantum well structure including a light emitting layer.

* * * * *